United States Patent
Kuekes et al.

(10) Patent No.: US 6,256,767 B1
(45) Date of Patent: Jul. 3, 2001

(54) DEMULTIPLEXER FOR A MOLECULAR WIRE CROSSBAR NETWORK (MWCN DEMUX)

(75) Inventors: Philip J. Kuekes, Menlo Park; R. Stanley Williams, Mountain View, both of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/282,049

(22) Filed: Mar. 29, 1999

(51) Int. Cl.$^7$ .................................................. G06F 17/50
(52) U.S. Cl. ............................... 716/9; 326/41; 700/121; 257/23; 365/151
(58) Field of Search ............................... 326/41; 700/121; 365/151; 427/126.3; 716/9; 257/23

(56) References Cited

U.S. PATENT DOCUMENTS

| | | | |
|---|---|---|---|
| 3,975,623 | * 8/1976 | Weinberger | 708/232 |
| 4,208,728 | * 6/1980 | Blahut et al. | 365/189.08 |
| 5,475,341 | * 12/1995 | Reed | 327/566 |
| 5,519,629 | * 5/1996 | Snider | 716/17 |
| 5,557,533 | * 9/1996 | Koford et al. | 716/9 |
| 5,589,692 | * 12/1996 | Reed | 257/23 |
| 5,603,983 | * 2/1997 | Clough et al. | 427/126.3 |
| 5,640,343 | * 6/1997 | Gallagher et al. | 365/171 |
| 5,729,752 | * 3/1998 | Snider et al. | 712/11 |
| 5,790,771 | * 8/1998 | Culbertson et al. | 714/3 |
| 5,861,761 | * 1/1999 | Kean | 326/41 |
| 5,903,461 | * 5/1999 | Rostoker et al. | 700/121 |
| 6,128,214 | * 10/2000 | Kuekes et al. | 365/151 |

OTHER PUBLICATIONS

Heath, et al.; "A liquid solution synthesis of single crystal germanium quantum wires"; Chemical Physics Letters; Mar. 1993; pp. 263–268.*

Morales, et al.; "A Laser Ablation Method for the Synthesis of Crystalline Semiconductor Nanowires"; Science Magazine; Jan. 1998; pp. 208–211.*

Guo, et al.; "Nanoscale Silicon Field Effect Transistors Fabricated Using Imprint Lithography"; American Institute of Physics; Sep. 1997; pp. 1881–1883.*

Heath, et al.; "A Defect–Tolerant Computer Architecture:Opportunities for Nanotechnology"; American Association for the Advancement of Science; Jun. 1998; vol. 280; pp. 1716–1721.*

Menon, et al.; "Fabrication and Evaluation of Nanoelectrode Ensembles"; Analytical Chemistry; Jul. 1995; vol. 67; pp. 1920–1928.*

(List continued on next page.)

*Primary Examiner*—Matthew Smith
*Assistant Examiner*—Jibreel Speight

(57) ABSTRACT

A demultiplexer for a two-dimensional array of a plurality of nanometer-scale switches (molecular wire crossbar network) is disclosed. Each switch comprises a pair of crossed wires which form a junction where one wire crosses another and at least one connector species connecting said pair of crossed wires in said junction. The connector species comprises a bi-stable molecule. The demultiplexer comprises a plurality of address lines accessed by a first set of wires in the two-dimensional array by randomly forming contacts between each wire in the first set of wires to at least one of the address lines. The first set of wires crosses a second set of wires to form the junctions. The demultiplexer solves both the problems of data input and output to a molecular electronic system and also bridges the size gap between CMOS and molecules with an architecture that can scale up to extraordinarily large numbers of molecular devices. Further, the demultiplexer is very defect tolerant, and can work despite a large number of defects in the system.

33 Claims, 7 Drawing Sheets

OTHER PUBLICATIONS

Guo, et al.; "A Silicon Single–Electron Transistor Memory Operating at Room Temperature"; Science Magazine; Jan. 1997; vol. 275; pp. 649–651.*

Trans, et al.; "Room–Temperature Transistor Based on a Single Carbon Nanotube"; Nature Magazine; May 1998; vol. 393; pp. 49–54.*

Likharev; "Correlated Discrete Transfer of Single Electrons in Ultrasmall Tunnel Junctions"; IBM J. Res. Develop.; Jan. 1988; vol. 32; pp. 144–158.*

Jones, Jr., et al.; "Ferroelectric non–volatile memories for low–voltage, low–power applications"; Thin Solid Films; 1995; vol. 270; pp. 584–588.*

Amabilino, et al.; "Aggregation of self–assembling branched"; New Journal Chemistry; 1998; pp. 959–972.*

Vossmeyer, et al.; "Combinatorial approaches toward patterning nanocrystals"; American Institute of Physics; Oct. 1998; vol. 84; pp. 3664–3670.*

Leff, et al.; "Thermodynamic Control of Gold Nanocrystal Size: Experiment and Theory"; Journal Physics Chem.; 1995; pp. 7036–7041.*

Holloway, et al.; "Electron–Transfer Reactions of Metallocenes Influence of Metal Oxidation State on Structure and Reactivity"; American Chemical Society; 1979; pp. 2038–2044.*

Mead, et al.; "Introduction to VLSI Systems"; HPL/Research Library; 1980; pp. 79–82.*

* cited by examiner

DEMULTIPLEXER FOR A MOLECULAR WIRE CROSSBAR NETWORK (MWCN DEMUX)

CROSS-REFERENCE TO RELATED APPLICATIONS

The present application is related to the following applications: Ser. No. 09/280,189 ("molecular Wire Crossbar Memory"); Ser. No. 09/282,045 ("Molecular Wire Crossbar Logic"); Ser. No. 09/280,225 ("Molecular-Wire Crossbar Interconnect"); and Ser. No. 09/280,188 ("Molecular Wire Transistors"); and Ser. No. 09/292,767 ("Chemically Synthesized and Assembled Electronic Devices"), all filed on even date herewith. The present application employs the chemical synthesis and assembly techniques disclosed and claimed in Ser. No. 09/292,767, the crossbar interconnections disclosed and claimed in Ser. No. 09/280,225, the molecular wire transistors disclosed and claimed in Ser. No. 09/280,188, and the logic circuits disclosed and claimed in Ser. No. 09/282,188.

TECHNICAL FIELD

The present application relates generally to making connections to integrated circuits of electronic devices whose functional length scales are measured in nanometers, and, more particularly, to demultiplexers based on nanometer-scale wires crossed by larger wires and joined by bi-stable molecular scale switches at the intersecting junctions.

BACKGROUND ART

The silicon (Si) integrated circuit (IC) has dominated electronics and has helped it grow to become one of the world's largest and most critical industries over the past thirty-five years. However, because of a combination of physical and economic reasons, the miniaturization that has accompanied the growth of Si ICs is reaching its limit. The present scale of devices is on the order of tenths of micrometers. New solutions are being proposed to take electronics to ever smaller levels; such current solutions are directed to constructing nanometer scale devices.

Prior proposed solutions to the problem of constructing nanometer scale devices have involved (1) the utilization of extremely fine scale lithography using X-rays, electron, ions, scanning probes, or stamping to define the device components; (2) direct writing of the device components by electrons, ions, or scanning probes; or (3) the direct chemical synthesis and linking of components with covalent bonds. The major problem with (1) is that the wafer on which the devices are built must be aligned to within a fraction of a nanometer in at least two dimensions for several successive stages of lithography, followed by etching or deposition to build the devices. This level of control will be extremely expensive to implement. The major problem with (2) is that it is a serial process, and direct writing a wafer full of complex devices, each containing trillions of components, could well require many years. Finally, the problem with (3) is that the only known chemical analogues of high information content circuits are proteins and DNA, which both have extremely complex and, to date, unpredictable secondary and tertiary structures that causes them to twist into helices, fold into sheets, and form other complex 3D structures that will have a significant and usually deleterious effect on their desired electrical properties as well as make interfacing them to the outside world impossible.

The present inventors have developed new approaches to nanometer-scale devices, comprising crossed nano-scale wires that are joined at their intersecting junctions with bi-stable molecules, as disclosed and in application Ser. No. 09/282,767, filed on even date herewith. Wires, such as silicon, carbon and/or metal, are formed in two dimensional arrays. A bi-stable molecule, such as rotaxane, pseudo-rotaxane, or catenane, is formed at each intersection of a pair of wires. The bi-stable molecule is switchable between two states upon application of a voltage along a selected pair of wires.

There is at present no known or published solution for addressing molecular scale devices and getting information into or out of a molecular system such that it can be read or accessed by a much larger system, for instance, CMOS. All present solutions for connection end up making the molecular scale devices spread out on a scale comparable with available lithography or direct writing capability. A "wagon wheel" strategy, for example, does this, where nano-scale wires are formed, fanning out from a central "spoke". The overlap of two such adjacent "wagon wheels" forms intersecting junctions where each pair of wires cross to form a molecular wire crossbar. When all of the wires in the molecular wire crossbar must spread out, however, the total size of the system, including input/output (I/O), becomes comparable with the area of a lithographically formed system, and thus much of the size advantage of a molecular scale system is lost.

Thus, there remains a need for getting information into and out of a nanometer-scale molecular wire crossbar, also known as a chemically assembled electronic nanocomputer.

DISCLOSURE OF INVENTION

In accordance with the present invention, a demultiplexer for a two-dimensional array of a plurality of nanometer-scale switches is disclosed. Each switch comprises a junction formed by a pair of crossed wires where one wire crosses another and at least one connector species connecting said pair of crossed wires in said junction. The connector species comprises a bi-stable molecule. The demultiplexer is assembled in parallel and comprises a plurality of microscopic address lines accessed by a first set of wires in the two-dimensional array by randomly forming contacts between each nanoscopic wire in the first set of wires to at least one of the address lines. The first set of wires crosses a second set of wires to form the junctions. Alternatively, the demultiplexer is serially assembled, which involves sequentially forming the contacts rather than randomly forming the contacts, as in the parallel assembly.

The present invention solves both the problems of data input and output to a molecular electronic system and also bridges the size gap between CMOS and molecules with an architecture that can scale up to extraordinarily large numbers of molecular devices. It is important that the architecture be able to scale to a very large number of components. If all of the nanometer sized wires must be spread out to the same pitch as the lithographically-formed components with which they communicate, then the size advantages of the molecular wire nano-architecture are going to be lost. If, however, the wires are assembled at the full density that the nanometer spacing would allow, then in the space accessible to a single lithographically-formed wire, close to a hundred distinct molecular wires must be connected. This invention solves this problem, by allowing selective connection to all of the molecular wires.

The present invention creates a partially random circuit using a random or pseudo-random physical or chemical process. Measurements of the output of that random circuit as the inputs are varied enable conclusions to be drawn as to which random connections have, in fact, been made. The resulting list of random connections lets the circuit be used as a demultiplexer.

It is desirable that when the demultiplexer is in use, the current drawn must not scale with the number of signal wires in the array when only one wire is addressed. The transistor version of the present invention draws current which does not increase with the total number of signal wires.

Having found the unique addresses of each of the demultiplexer outputs (nanowires), the present invention provides a method to determine the exact linear order of the nanoscopic wires, that is, which nanowire is next to which other nanowire. This information is necessary to configure a circuit using transistors or wire cutting.

The proposals for using cellular automata as shift registers to make nanometer scale structures cannot realistically solve the problem of connecting to larger structures, because the cellular automata lack defect tolerance. If cellular automata could be built, then in principle only one cell in one corner of the automata needs to be connected, and a raster scan shift register could be used to load states into the entire machine. The problem is that this cellular automata structure is easily destroyed by defects. That is to say, there is no effective defect tolerance in such a structure. The demultiplexer for a molecular wire crossbar network that is disclosed and claimed herein is very defect tolerant, and can work despite a large number of defects in the system.

The molecular wire demultiplexer addresses the fundamental problems of bridging length scales to connect lithographically-formed microscopic circuits that have to communicate with the nanoscopic arrays of wires which make up logic, memory, and interconnect of the molecular wire system, and of transferring data into and out of a system with an enormous number of elements by using an input/output circuit with a much smaller number of elements.

BEST MODES FOR CARRYING OUT THE INVENTION

Definitions

Figure 1A:
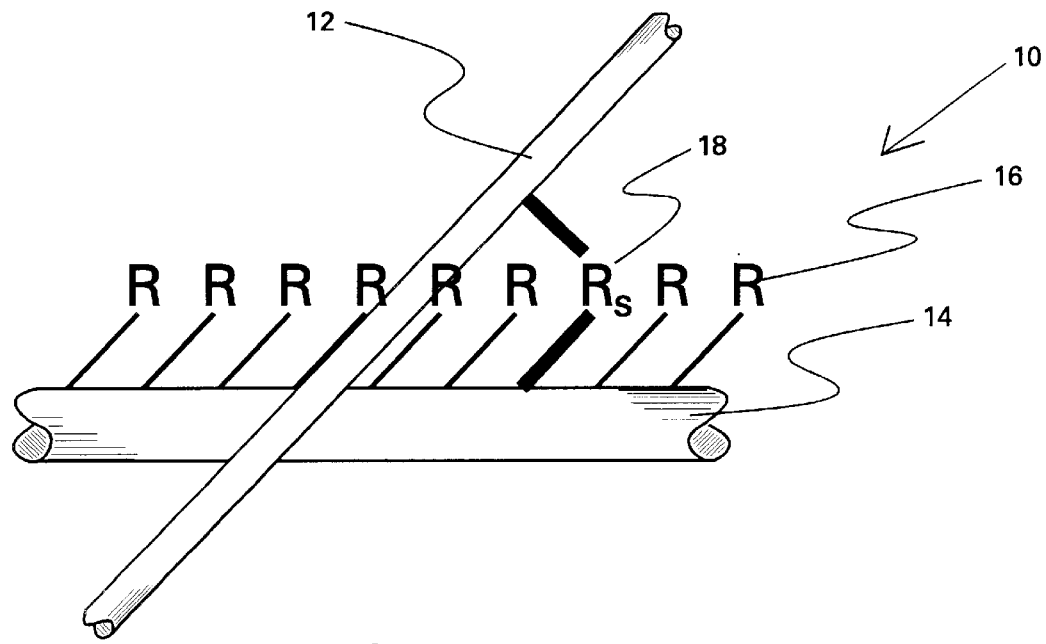
FIG. 1A is a schematic representation of two crossed nano-scale wires, with at least one molecule bridging the gap in accordance with the invention.

As used herein, the term "self-aligned" as applied to "junction" means that the junction that forms the switch and/or other electrical connection between two wires is created wherever two wires, either of which may be coated or functionalized, cross each other, because it is the act of crossing that creates the junction.

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read only memory (PROM), for example.

The term "reconfigurable" means that a switch can change its state multiple times via a reversible process such as an oxidation or reduction; in other words, the switch can be opened and closed multiple times such as the memory bits in a random access memory (RAM).

The term "bi-stable" as applied to a molecule means a molecule having two local energy minima, or states. The molecule may be either irreversibly switched from one state to the other (singly configurable) or reversibly switched from one state to the other (reconfigurable).

Micron-scale dimensions refers to dimensions that range from 1 micrometer to a few micrometers in size.

Sub-micron scale dimensions refers to dimensions that range from 1 micrometer down to 0.04 micrometers.

Nanometer scale dimensions refers to dimensions that range from 0.1 nanometers to 50 nanometers (0.05 micrometers).

Micron-scale and submicron-scale wires refers to rod or ribbon-shaped conductors or semiconductors with widths or diameters having the dimensions of 1 to 10 micrometers, heights that can range from a few tens of nanometers to a micrometer, and lengths of several micrometers and longer.

A crossbar is an array of switches that connect each wire in one set of parallel wires to every member of a second set of parallel wires that intersects the first set (usually the two sets of wires are perpendicular to each other, but this is not a necessary condition).

Crossed Wire Switch

In related patent application Ser. No. 09/292,767 filed on even date herewith, a basic scheme for chemically synthesized and assembled electronic devices is provided. That application discloses and claims a quantum state switch, which comprises an adjustable tunnel junction between two nanometer-scale wires. In accordance with that invention, an electronic device is provided, comprising two crossed wires having nanometer dimensions, provided with functionalizing groups that control conductivity type of the wires. A plurality of such crossed wires may be assembled to provide a variety of different devices and circuits.

That invention enables the construction of electronic devices on a nanometer scale using relatively stiff wires that are chemically functionalized to provide the desired electronic properties and which are then chemically-assembled to create active electronic devices simply by forming contact with other wires.

Figure 1B:
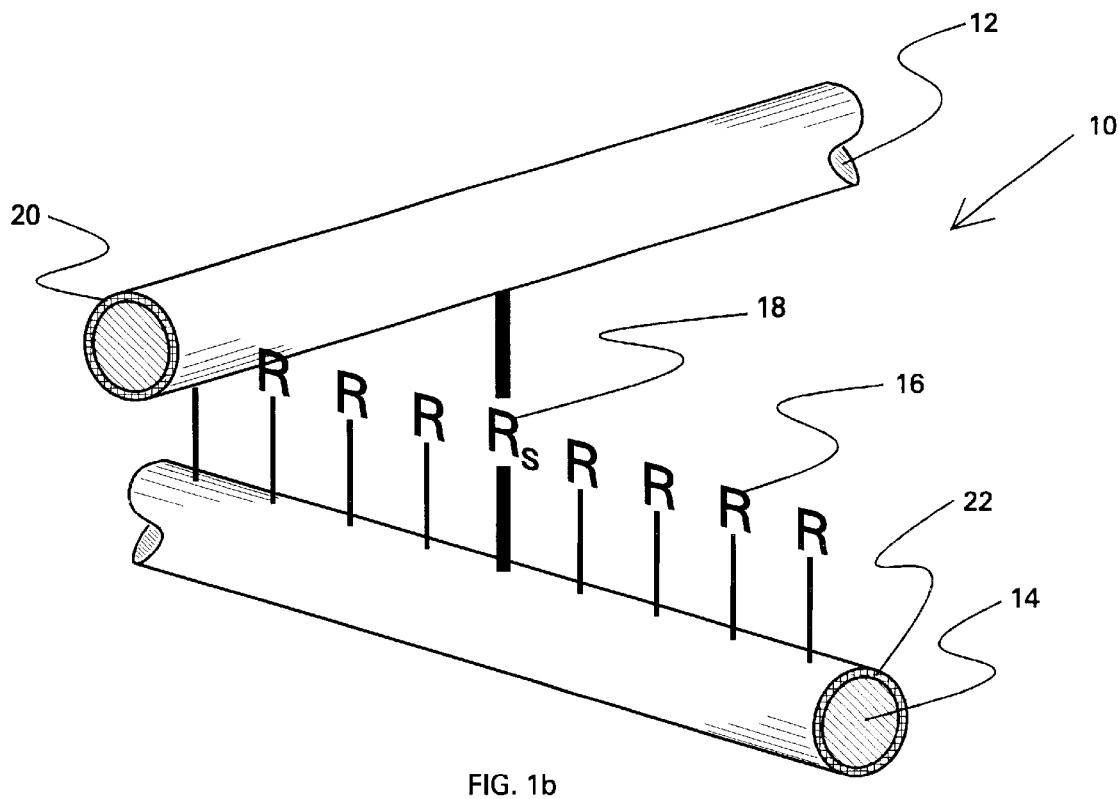
FIG. 1B is a perspective view, depicting the device shown in FIG. 1A.

The essential device features are shown in FIGS. 1A–1B. A crossed wire switch 10 comprises two wires 12, 14, each either a metal or semiconductor wire, that are crossed at some non-zero angle. In between those wires is a layer of molecules or molecular compounds 16, denoted R in FIGS. 1A and 1B. The particular molecules 18 (denoted $R_s$) that are sandwiched at the intersection, or junction, of the two wires 12, 14 are identified as switch molecules. When an appropriate voltage is applied across the wires, the switch molecules are either oxidized or reduced. When a molecule is oxidized (reduced), then a second species is reduced (oxidized) so that charge is balanced. These two species are then called a redox pair. One example of this device would be for one molecule to be reduced, and then a second molecule (the other half of the redox pair) is oxidized. In another example, a molecule is reduced, and one of the wires is oxidized. In a third example, a molecule is oxidized, and one of the wires is reduced. In a fourth example, one wire is oxidized, and an oxide associated with the other wire is reduced. In all cases, oxidation or reduction will affect the tunneling distance or the tunneling barrier height between the two wires, thereby exponentially altering the rate of charge transport across the wire junction, and serving as the basis for a switch.

Further, FIG. 1B depicts a coating 20 on wire 12 and a coating 22 on wire 14. The coatings 20, 22 may be modulation-doping coatings, tunneling barriers (e.g., oxides), or other nano-scale functionally suitable materials. Alternatively, the wires 12, 14 themselves may be coated with one or more R species 16, and where the wires cross, $R_s$ 18 is formed.

That invention allows electronic devices to be formed with a size on the order of tens of nanometers to a few nanometers simply by making contact between two wires. By choosing the molecules which form a doping layer on the wires (modulation doping), it is possible to build devices with a wide variety of specifically desired electrical properties. The possibility of reversibly or even irreversibly changing the properties of the device via an electrochemical reaction with a large hysteresis loop in its I–V characteristic enables devices to be altered after they are built and may provide new and useful functions.

The electronic device 10 of that invention, in its simplest state, is a quantum state switch comprising an adjustable tunnel junction 18 between two nanometer-scale wires 12, 14. A plurality of sets of wires, one set configured at an angle to the other, provides a two-dimensional array of switches. The wires are provided with a molecular species 16 at the junctions 18 that, in one embodiment, is bi-stable. The molecule species is addressed by setting voltages on the appropriate two wires. Thus, by the simple process of crossing one type of coated wire over the other, a switch is formed at wherever the intersection occurs; the exact position of the connecting point is not important for this architecture. Furthermore, the chemical species that form the molecular link between the wires can be electrochemically oxidized or reduced. Some types of molecules can be cycled reversibly and others will react irreversibly. The chemical state of the molecular switches determines the tunneling resistance between the two wires, which is exponentially dependent on both the width and the barrier height of the tunneling gap.

Figure 2:
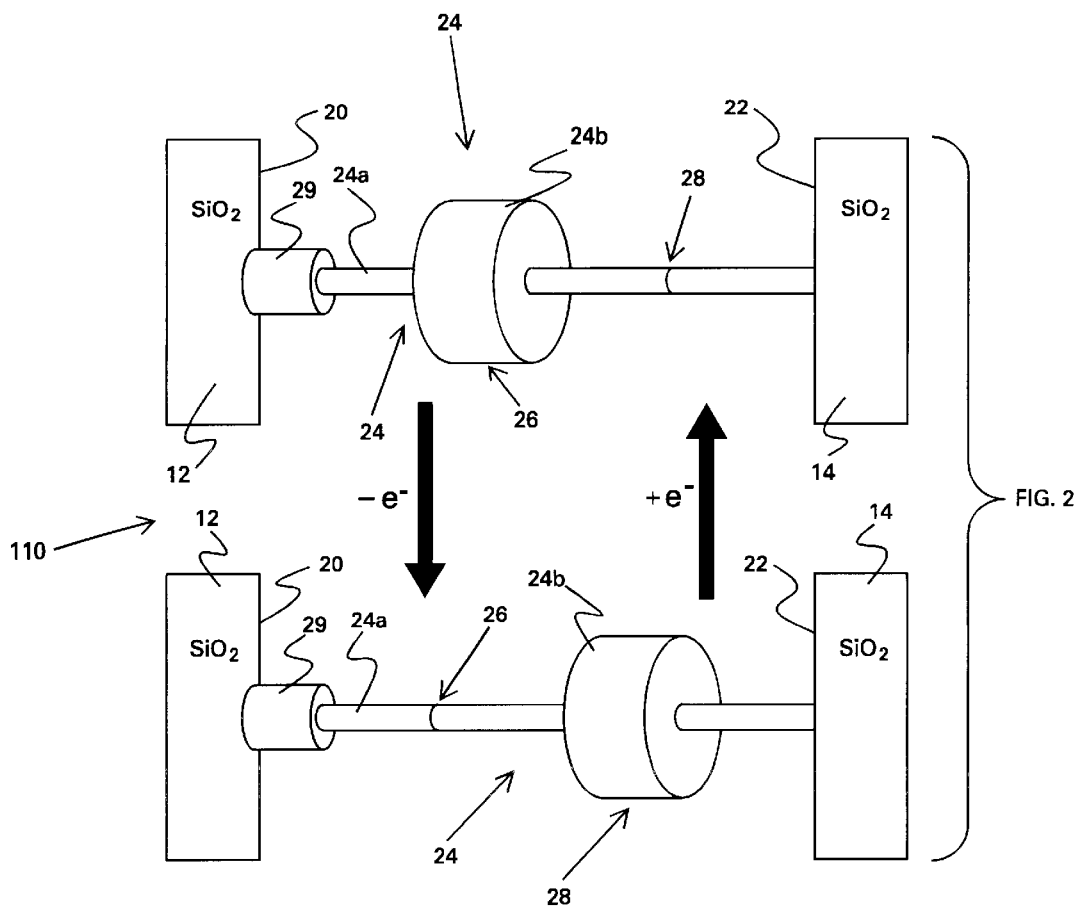
FIG. 2 is a schematic representation of two crossed nanowires, joined by a rotaxane, and depicting the two bi-stable states.

An example of a bi-stable molecular switch 110 is shown in FIG. 2, comprising a rotaxane 24. The rotaxane 24 contains two molecular components—a backbone 24a that contains one or more binding sites, and a circular molecule (the 'ring') 24b that fits around the backbone like a ring on a post. The ring 24b is in intimate mechanical contact, but is not chemically bonded to the backbone 24a. Depending on how the ring is fabricated, the ring may have one or more preferred minimum-energy locations along the backbone. In FIG. 2, these sites are denoted 26 (left site) and 28 (right site).

The moiety 29 on the left side of the rotaxane 24 shows that the molecule is asymmetric and therefore can have different properties when oxidized than when reduced.

Molecular Wire Array

Figure 3:
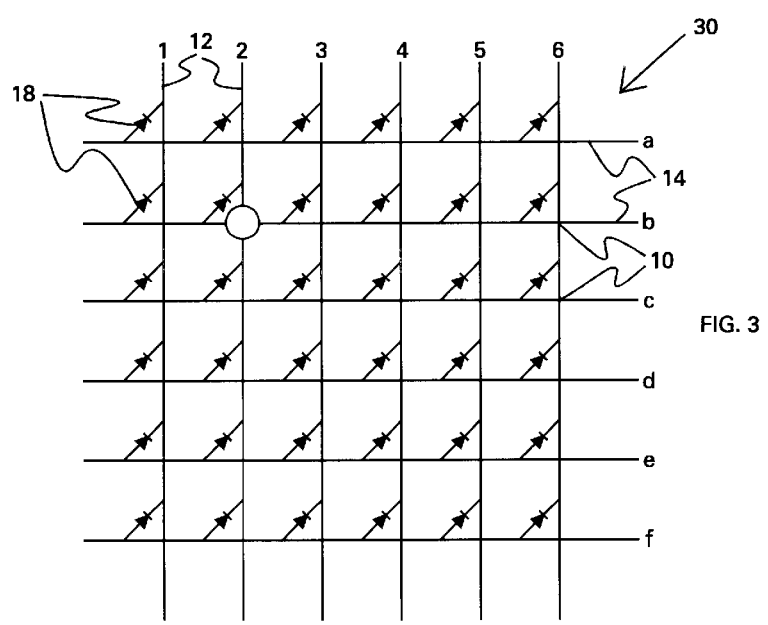
FIG. 3 is a schematic diagram depicting a diode crossbar architecture, which is employed in the practice of the present invention.

The present inventors have developed new approaches to nanometer-scale interconnect arrays as disclosed and in application Ser. No. 09/280,225, filed on even date herewith. A molecular-wire crossbar interconnect for signal routing and communications between a first level and a second level in a molecular-wire crossbar is provided. As shown in FIG. 3, the molecular wire crossbar 30 comprises a two-dimensional array of a plurality of nanometer-scale switches 10. Each switch 10 is reconfigurable and self-assembling and comprises a pair of crossed wires 12, 14 which form a junction 18 where one wire crosses another and at least one connector species 16 connecting the pair of crossed wires in the junction. The connector species 16 comprises a bi-stable molecule. Each level comprises at least one group of switches and each group of switches comprises at least one switch, with each group in the first level connected to all other groups in the second level in an all-to-all configuration to provide a scalable, defect-tolerant, fat-tree networking scheme. The primary advantage is ease of fabrication, because an active switch is formed any time two wires cross. This saves tremendously on circuit area (a factor of a few times ten), since no other wires or ancillary devices are needed to operate the switch or store the required configuration. This reduction of the area of a configuration bit and its switch to just the area of two crossing wires is a major advantage in constructing a defect-tolerant interconnect network.

Demultiplexers

Figure 4:
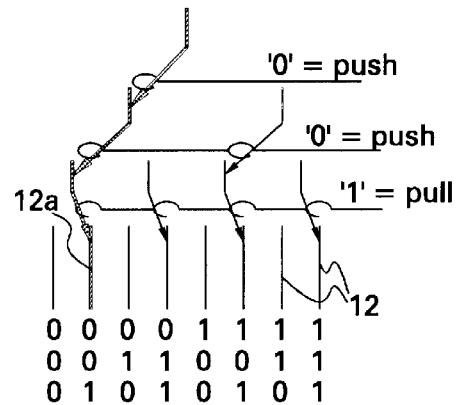
FIG. 4 is a schematic diagram of the logical function of a demultiplexer for selectively addressing a single vertical wire of an 8×8 crossbar (horizontal wires are not shown)

The job of getting information into and out of the molecular wire network 30 will require demultiplexers and multiplexers that can access enormous numbers of addresses, at least $10^{12}$ and eventually more, and also exchange information with the outside world, which in this case is assumed to be a very small amount of CMOS acting as a front end for the system. Consider a demultiplexer, which enables one to access a particular wire. In FIG. 4, the logical function of a demultiplexer is shown, using it to address a single vertical wire 12a of, for example, an 8–8 crossbar memory (horizontal wires are not shown). The wire addresses are indicated at the bottom, and the applied voltages are listed at the right.

Figure 5:
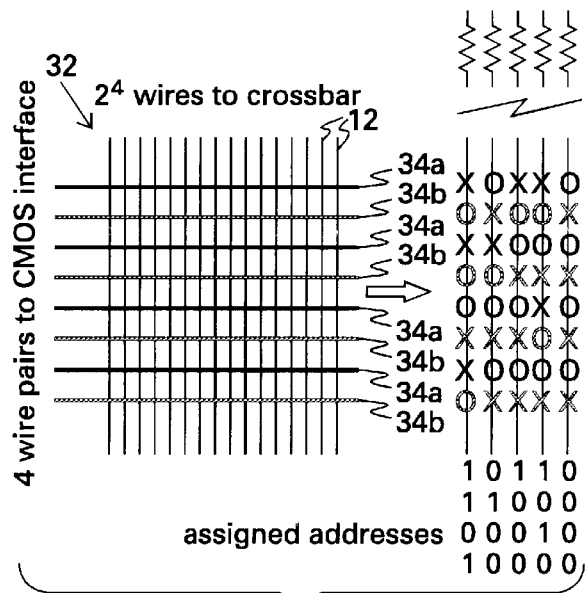
FIG. 5 is a schematic diagram depicting one possible demultiplexing scheme.

The major advantage of a demultiplexer has to do with scaling. In order to address $2^N$ locations, a demultiplexer only needs N wires. This logarithmic scaling is very important. The demultiplexer is not an obviously periodic structure, and so it is difficult to envision how to chemically fabricate it. FIG. 5 depicts one possible means for demultiplexing that would require a relatively small amount of lithographic definition or direct electron-beam writing of wires and connectors at the nanometer scale, such that they interface with both the appropriate CMOS and nanometer-scale wires.

The demultiplexer 32 shown in FIG. 5 may be made by depositing approximately P wire pairs across $2^P$ nanowires. Each junction of a lithographic wire with a single nanowire represents a bit address. If the junction resistance of wire 34a to nanowire 12 is low, then the junction resistance of wire 34b to nanowire 12 is high, and that address is "1". Thus, N wire pairs can uniquely address $2^N$ nanowires. This demultiplexer could actually be used to configure a logical multiplexer on demand, thereby greatly simplifying the input/output hardware task.

With continuing reference to FIG. 5, at left is shown sixteen wires 12 that form one-half of a molecular wire crossbar 30, intersected with four complementary wires 32a, 32b that lead to a CMOS decoder (not shown). A portion of this system is shown at right. Addresses (low and high resistance junctions) are assigned at the CMOS/-nano-wire interfaces. Addressing an individual nano-wire with the multiplexer is equivalent to performing a 4-input AND function. The molecular wire demultiplexer 32 addresses the fundamental problem of connecting lithographically-formed microscopic circuits which have to communicate with the nanoscopic arrays of wires which make up logic, memory and interconnect of the system. There is a significant bootstrapping problem here. The pitch, the wire-to-wire separation of the nanowires, is one or two orders of magnitude less than the pitch of lithographically-formed wires. Since all of the methods for the programming of the configuration bits of any of the types of molecular wire arrays involve being able to make contact with all the wires in the array, there is a serious problem of how to make connection to the outside world without increasing the size of the arrays to microscopic dimensions. A demultiplexer would solve this problem since it would only use a small number of "large" wires to address a large number of nanowires. The problem is that the pattern of logical connections required to form a demultiplexer is rather complex. It is not a regular pattern, which is easy to form by a chemical process. A decoder/demultiplexer would permit use of a small multiple of log N wires of microscopic dimensions to address any one of N lines of nanoscopic dimensions in the crossbar. (All logs are base 2.)

Serial Assembly

Figure 6:
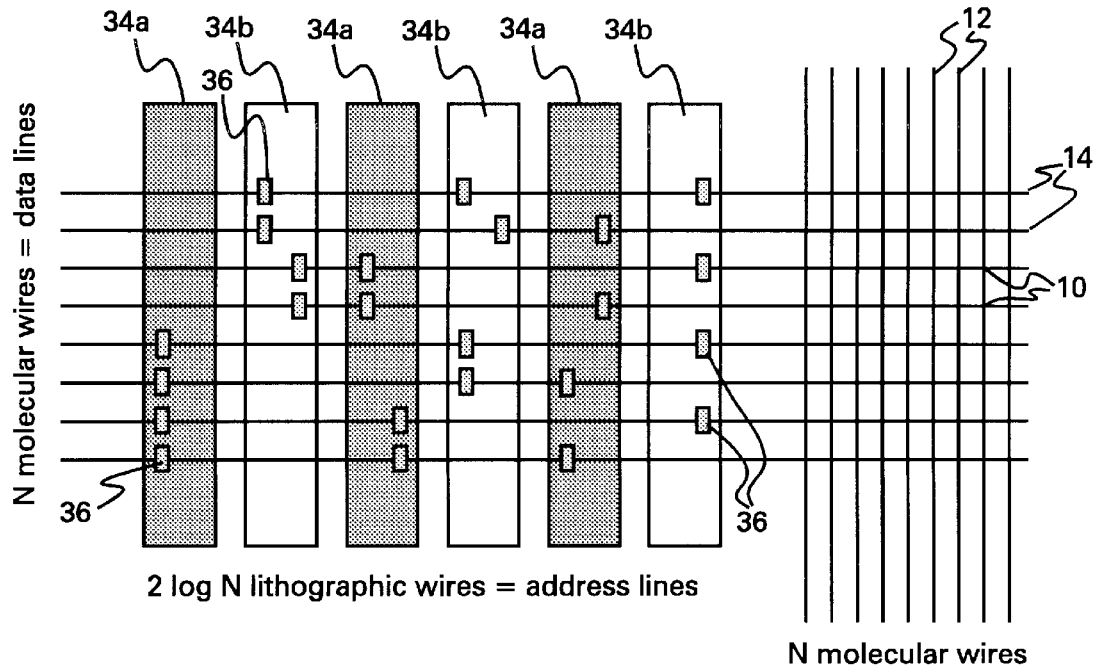
FIG. 6 is a schematic diagram of patterned addresses.

FIG. 6 shows the simplest serial solution for demultiplexer 132 of the present invention. First, 2 log N address wires 34a, 34b are formed lithographically and electron beam or ion beam lithography is used to make contact (as shown by the squares 36) with the nanowires 14. A complex pattern equivalent to that of FIG. 4 is written. This is a serial process and may take N log N time. Each data line has a unique address by construction.

Parallel Assembly

Figure 7:
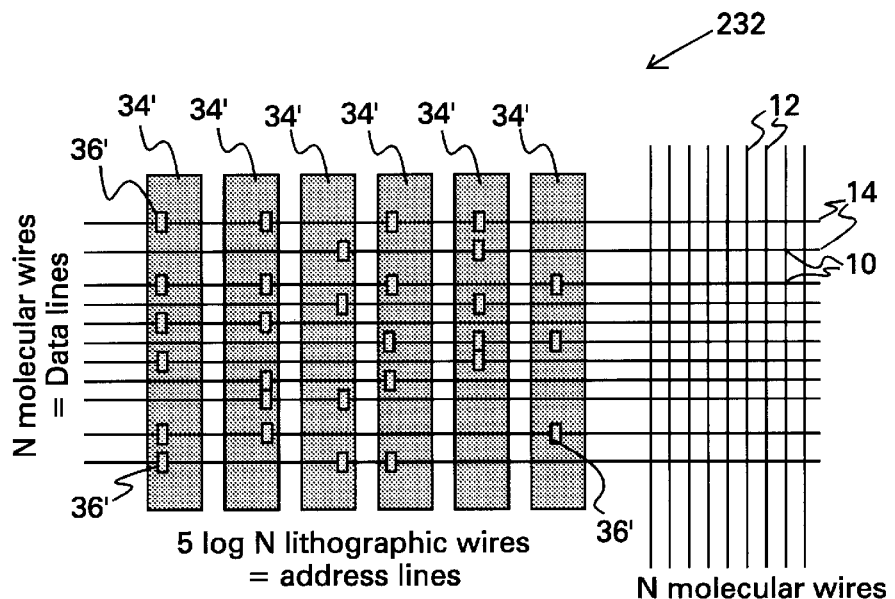
FIG. 7 is a view similar to that of FIG. 6, depicting a schematic diagram of random connections.

The parallel assembly version for the demultiplexer 232 of the present invention, depicted in FIG. 7, allows the bootstrapping of a demultiplexer by making a set of random connections such that approximately 5 log N microscopic wires 34' are enough to address N nanoscopic wires 14, if an appropriate random connection is used. The random connection can be done chemically. A chemical process which has a 50/50 chance of happening or not happening can be used. The preferred example of such a process is using a randomly-deposited, colloidal-sized (a diameter of nanometers) dot to either make contact or not make electrical contact between a nanowire and a microscopic address wire. One example is a doping molecule (p-type) attached by thiols to a colliodal gold dot. If the nanowires in the array are n-doped semiconductor, then a pass transistor will be formed at random when the gold dot lies between the microscopic address wire (gate) and the nanowire (source and drain) Alternatively, a single molecule may be randomly deposited to make or not make contact between the nanowire and the lithographic wire. In either case, there must be a definite threshold, contact is either made or not made.

A connection to the gate of a transistor (not shown) is depicted by a square 36' in FIG. 7. A transistor on a nanowire which is normally ON, i.e., conducting if there is no connection made to its gate, can be used. If there is a connection made to its gate, then the transistor can be either ON or OFF, depending on the voltage of the address line connected to the gate. Since all of the transistors along a given nanowire entering a crossbar are in series, if only one wire of the N wires has all of its transistors enabled in the conduction state, then only that wire will draw current. This greatly minimizes the power consumed by the demux circuit 232. N could be a very large number. It will be shown below how a random set of connections can almost certainly provide a unique address for each wire.

The molecular wire transistors disclosed and claimed in co-pending application Ser. No. 09/280,188, filed on even date herewith may be advantageously employed herein as the transistors mentioned above.

By way of digression, such molecular wire transistors each comprise a pair of crossed wires 12, 14, with at least one of the wires comprising a modulation-doped semiconductor material 20, 22, as shown in FIGS. 1A–1B. The pair of crossed wires 12, 22 forms a gate junction where one wire crosses another, one wire being provided with Lewis acid functional groups and the other wire being provided with Lewis base functional groups. Alternatively, one wire is internally doped and the other wire is provided with either Lewis acid or Lewis base functional groups.

If both functionalized wires are doped semiconductor, such as silicon, one is p-doped and the other is n-doped. One wire of a given doping comprises the "emitter" and "collector" portions and the other wire induces the "base" function in the first wire containing the emitter and collector at the junction where the wires cross, between the emitter and collector portions. The "base" region is always modulation doped in this invention. Both pnp and npn transistors that are analogous to bipolar transistors may be formed in this fashion.

One functionalized wire may comprise doped semiconductor, such as silicon, and the other functionalized wire may comprise a metal. Here, the doped silicon wire comprises the "source" and "drain" and the metal wire induces the "gate" function on the doped silicon wire where the wires cross, between the source and drain, to form a field effect transistor. The "gate" region is always modulation doped in this invention. Both n-channel and p-channel transistors that are analogous to field effect transistors may be formed in this fashion.

Further, a molecular memory effect (state change) may be incorporated into the coatings 20, 22 that dope the wires 12, 14. By choosing the molecule that does the doping of the gate to have two distinct oxidation-reduction (redox) states, a conductive state and a relatively insulating state with a large I–V hysteresis separating the two, it then becomes possible to have a special type of transistor. If the state change is set, then a transistor is formed, but if the state change is not set, then either an open or closed switch is formed. Whether a switch is open or closed depends on the state of a wire coating—whether it is oxidize or reduced.

A second version of molecular memory effect (molecular configuration bit) is to use a bi-stable molecule (connecting species 16) such that if the memory bit is set, the semiconductor wire is n-doped along its entire length and conducts. But if the memory bit is reset by applying a sufficient voltage difference between the two wires, then the molecule induces a p-type region through modulation doping, and the semiconductor wire will not conduct across the region where the wires cross. The n and p regions can be interchanged to make another form of that invention.

That invention enables the construction of transistors on a nanometer scale, which are self-aligned and modulation-doped. This is in contrast to prior art transistors, in which it is ordinarily very difficult at a nanometer scale to position and align the three components of a bipolar transistor (emitter, base collector) or a field effect transistor (source, gate, and drain). It is also ordinarily very difficult at a length scale defined in angstroms to control the exact properties of the doping that defines the electrical properties of the semiconductor in such prior art transistors.

That invention allows transistors to be formed with a size on the order of tens of nanometers to a few nanometers. By choosing the molecules which form the doping layer, it is possible to build transistors with a wide variety of specifically desired electrical properties. The inclusion of an electrically settable memory bit, through an electrochemical reaction with a large hysteresis loop in its I–V characteristic, as part of the molecules that define the gate region allows a new and useful function to be added to transistors. Another advantage of that invention is that the same technology allows one to choose to build both npn and pnp bipolar transistors as well as p-channel and n-channel FETs.

Figure 8:
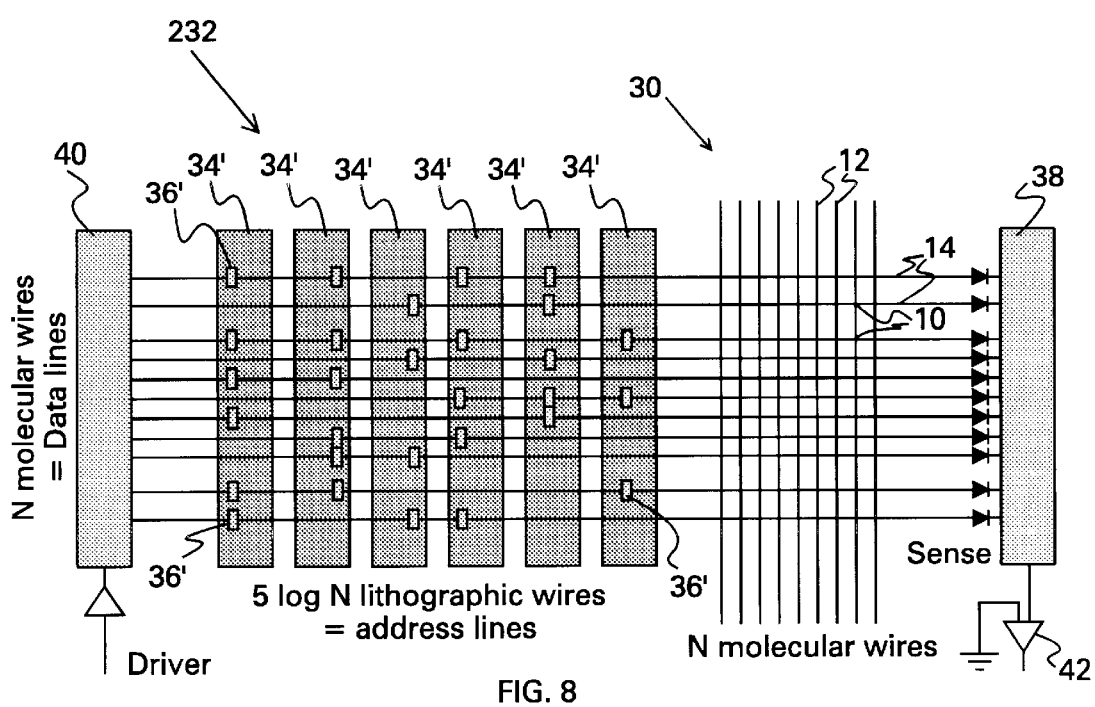
FIG. 8 is a view similar to that of FIG. 6, depicting a schematic diagram of addressing, employing transistors.

Returning now to the present invention, if the given address wire is disconnected from a particular signal wire that is to be addressed, then a voltage is applied which would turn off (make non-conducting) the transistor at the intersection of any signal wire connected to the address wire. On the other hand, if a given address wire is known to connect to the signal wire that is to be addressed, then a voltage is applied which will turn on (make conducting) the transistor. The OFF address wires will have no effect on signal wires which are disconnected from them, and all of the other transistors will be ON, thus allowing current to flow through one and only one signal wire; see FIG. 8. As shown in FIG. 8, all of the molecular wires 14 are shorted together by a conductor 38 at one end so as to be driven by a single conventional CMOS driver 40. But in the array 30 itself at the right, only one of the molecular wires is effectively biased. Exactly one wire has a low resistance path to the driver 40. The particular wire that is addressed is the only one to have all of the transistors in series in the conducting low resistance state. The other (N-1) wires have high resistance paths.

Diode Array

Figure 9:
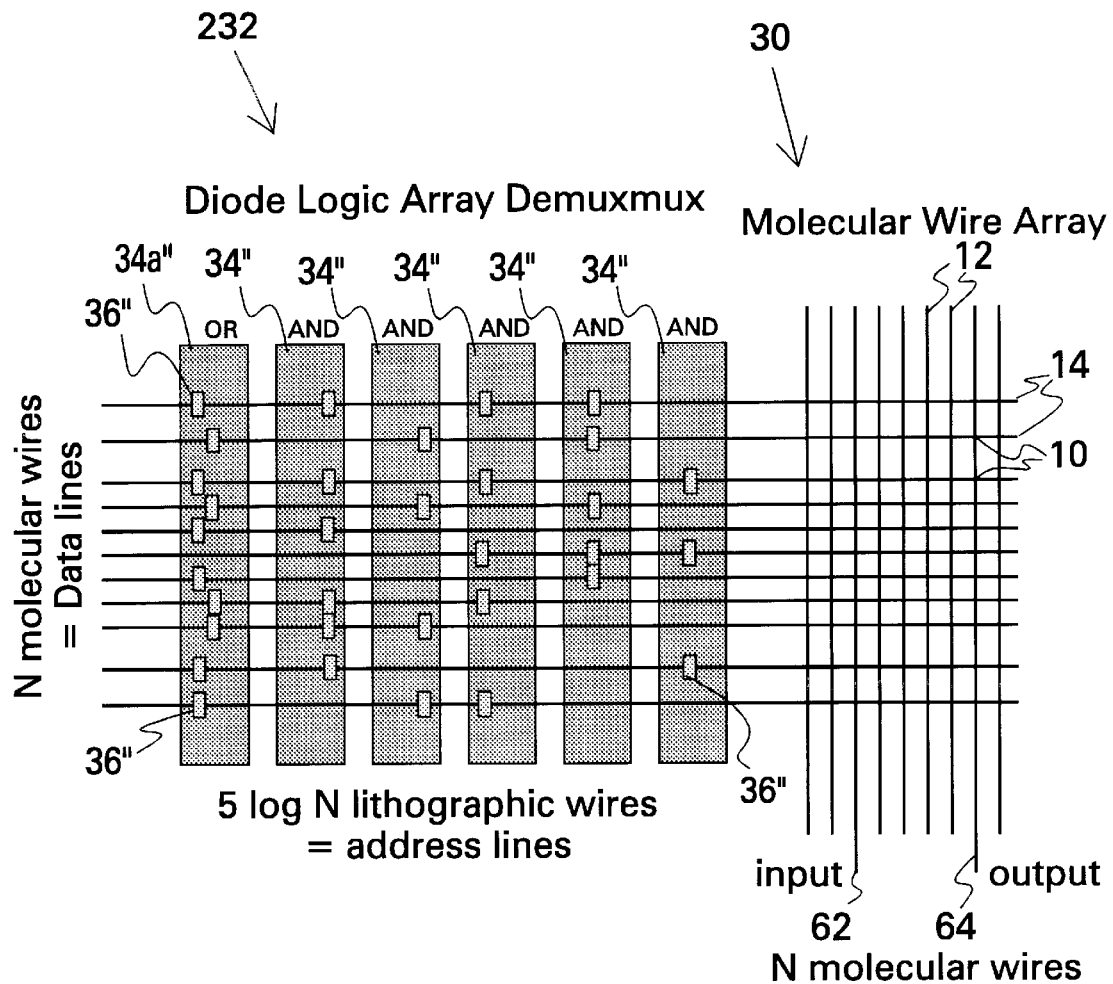
FIG. 9 is a view similar to that of FIG. 8, depicting an alternate embodiment, employing diodes.
Figure 10:
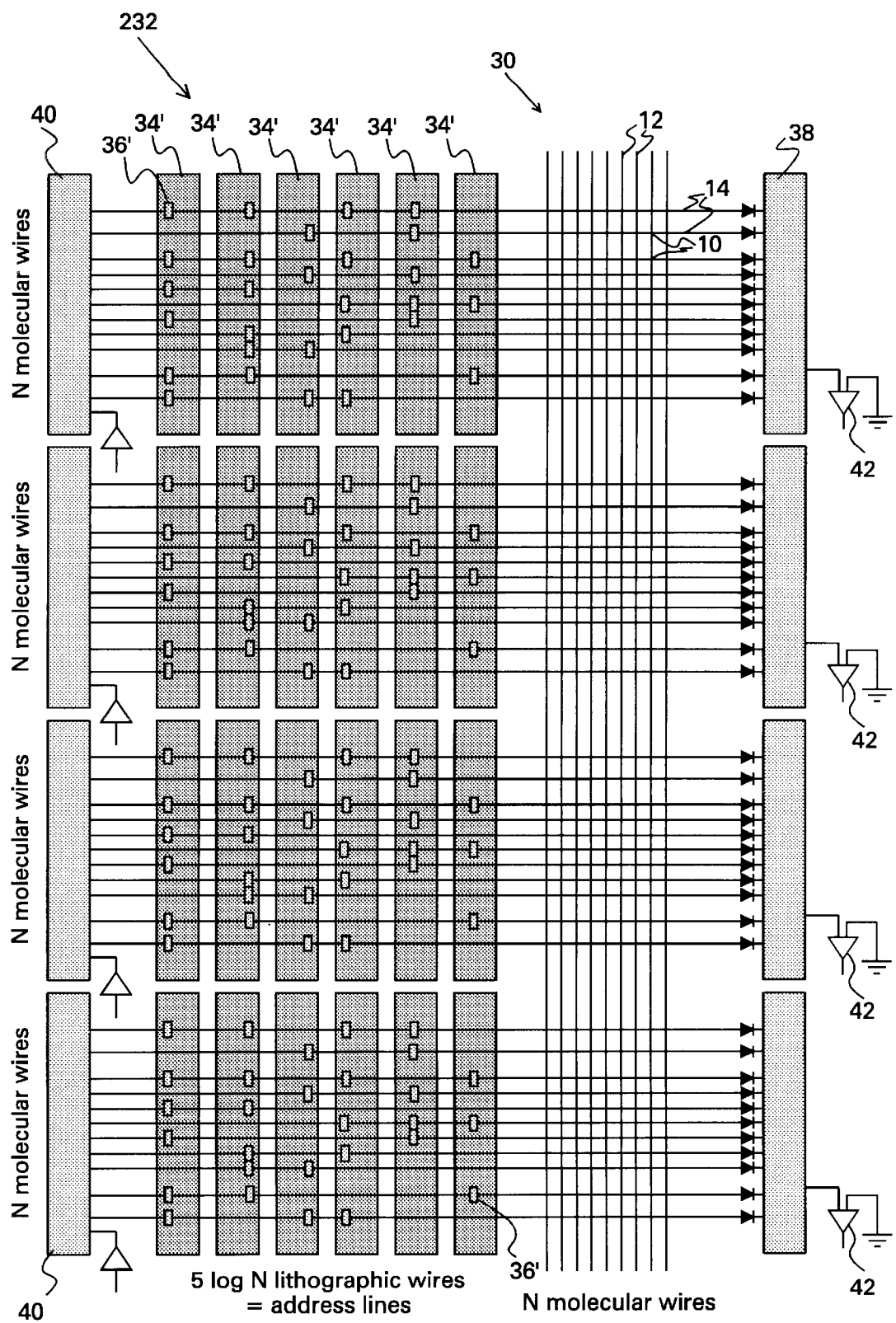
FIG. 10 is a view similar to that of FIG. 6, depicting a schematic diagram of array addressing.

In general, a demultiplexer performs a P-input AND function to select a given wire. The essence of the present invention is to use a random means to construct a distinct P-input AND function for each of the N nanowires to be addressed. The transistors, described above, perform the AND function by switches (transistors) connected in series. Alternatively, as shown in FIG. 9, diodes that are randomly connected in parallel can be used to perform an AND function as disclosed and claimed in application Ser. No. 09/282,045, filed on even date herewith. Thus, each connection, shown as a square 36" in FIG. 9, could alternatively be implemented as a diode randomly connecting a lithographic address wire 34" to a molecular data wire 14. In that case, all of the nanowires except the one selected would be pulled low. The selected wire would remain high. If all of the horizontal nanowires 14 are connected with diodes to the "OR" lithographic vertical wire 34a in FIG. 9, then the output of that wire can be used instead of the sense amp 42 of FIG. 8 to test which unique random addresses have been selected. The diode version of the present invention has the advantage that only one end of the nanowire array 30 needs to be attached to lithographic-sized wires 34". It will be apparent to one skilled in the art, that various combinations of the diode array and the transistor array can be used to make a demultiplexer.

Uniqueness of Addresses

If the number of address wires is about 4 log N, then almost always (if they are connected with 50% probability) there will be approximately 2 log N address wires which are either connected to a given specific crossbar signal wire A and not connected to a given specific crossbar signal wire B (Case 1), or which are connected to a given specific crossbar signal wire B and not connected to a given specific crossbar signal wire A (Case 2). Crossbar signal wire B and crossbar signal wire A can be addressed independently of each other if the 2 log N address wires are not all Case 1 or if the 2 log N address wires are not all Case 2. Thus, with 4 log N randomly connected address lines, there are 2 chances in $N^2$ that any two specified wires A and B can not be addressed independently of each other. The probability that all N(N−1)/2 possible pairs of N wires can be addressed independently of each other is $e^{-1}$ (about 0.37). By using W+4 log N wires, the probability of successful independent addressing is exp(−W/2). W is a small integer chosen by the circuit designer to achieve an appropriate probability of successful independent addressing. For example, in the case of W=log N, i.e., using 5 log N wires, this probability of successful independent addressing is increased to $\exp(-1/N^{1/2})$, which for N=100, is about 0.90. There is a reasonable probability that all of the signal lines have unique addresses. If a small number share addresses or are unaddressable, these can be marked as defective and dealt with, using defect tolerance methods disclosed in, for example, U.S. Pat. No. 5,790,771, "Apparatus and Method for Configuring a Reconfigurable Electronic System Having Defective Resources", issued to W. B. Culbertson et al on Aug. 4, 1998, and assigned to the same assignee as the present invention.

Address Determination

The problem then becomes one of finding the actual addresses that have been randomly chosen for each crossbar signal wire. It will now be shown that this can be done in time proportional to (N log N). The method used is as follows: First, M of the address lines (M approximately equal to log N) are chosen at random, one after another. Each time a new address line is chosen, its voltage is set to the OFF state. Each line selected will kill (make non-conducting) about half of the N signal lines. Each address line selected cuts the current drawn by the signal wires approximately in half. The sense amp 42 in FIG. 8 measures the current being drawn.

After about M address lines have been chosen, the current will drop to zero. (One must be able to distinguish the current through exactly one signal line from zero.) The last address wire selected is then changed back to the ON voltage. One can now be reasonably confident that a signal line is being addressed. With these log N lines frozen in place, each of the remaining 4 log N address lines is then tested to see if they are connected or disconnected by testing each in the ON and OFF mode and observing whether current is being drawn or not. Thus, there are a total of 5 log N tests, which are done for each of the N signal wires for a total test time of 5N log N. As each address is found, one may reconfigure the diode in the OR gate 34a" to disconnect the nano-wire just found and to make sure that it will not be found twice. The same can be done with the corresponding diodes attached to the conductor 38 in FIG. 8, with the collection of diodes logically performing an OR function. It will be apparent that 5N log N bits of data are needed in a system memory which is used to alias the N addresses of the signal wires. These can be stored in a large conventional memory, since they are only used for the testing of the molecular wire crossbar devices in the manufacturing facility and the original creation of a useful circuit.

As a practical matter, it may be necessary to group the N signal wires 14 into groups of size L, in order to detect if one or no wires have been addressed by measuring the total current through L wires 14. L−1 wires in a high resistance state will be in parallel with one low resistance wire as shown in FIG. 9. To measure a difference in the addressed wire when the resistance of one transistor changes from high to low, the high resistance must be about L times the low resistance. If there is one CMOS driver 40 for each L nanowires 14, then L=100 may be an appropriate value. If L is 128, then 5 log L is 35. The optimal value of L depends on the ratio of ON to OFF resistances of the molecular wire transistors.

The value 5 log N is only a useful approximation for the number of address lines needed. In general, W+4 log N lines will yield all unique addresses with probability exp(−W/2).

Determining the Order of the Nanowires

Once a unique address for each nanowire has been found, one would like to know how the nanowires are ordered, i.e., which nanowire is next to which other nanowire. This information is necessary to configure a circuit using transistors or wire cutting.

Cutting and Reconnecting Wires

As described in co-pending patent application Ser. No. 09/280,225 ("Molecular Wire Crossbar Interconnect"), in order to create an arbitrary circuit from a highly ordered set of wires and switches such as a crossbar, it is necessary to make cuts at specific locations to break the electrical continuity along certain wires (in the plane of the crossbar 30). This enables functions in one part of the regular array of wires and switches to be isolated from those of other parts, and in conjunction with open switches between the two layers of a crossbar allows electrical signals from different functions to be routed through each other without interfering. Given the fact that the crossbars 30 described herein are made from junctions 18, which are essentially electrochemical cells, between sets of crossing wires 12, 14, such cuts can be made by over-oxidizing a particular junction to consume a localized region of the wire to be cut, and thus form an insulating gap that breaks the electrical continuity of that wire at the desired location. Thus, there are at least three different voltage levels (which may be different magnitudes of the same polarity or involve different polarities) utilized in configuring a crossbar into a communications interconnect and using it. The first voltage level is relatively large, and it is used only to overoxidize a junction to create an electrical break in a wire. The next voltage level is smaller in magnitude, and it is used to oxidize or reduce some or all of the molecules or materials between two wires to open or close a switch and thus disable or enable a particular type of connection between the wires in different levels of the crossbar. Finally, the third voltage is the smallest in magnitude, and that is the voltage level used to actually propagate information through the circuit. The three voltages must be separated enough from each other to avoid unintentional setting of switches or cutting of wires by signal propagation. Based on the teachings herein, that is not considered to constitute undue experimentation on the part of the person skilled in the art.

In addition, by including switches described in co-pending patent application Ser. No. 09/280,188 ("Molecular Wire Transistor"), the interconnect can be configured by setting configuration bits which make or break electrical connections along the wires at specific locations to make break the electrical continuity along certain wires (in the plane of the crossbar). The specific location of the break is determined by the point at which the wire which forms the gate crosses the semiconducting wire which forms the source and drain.

Divide and Test

Figure 11D:
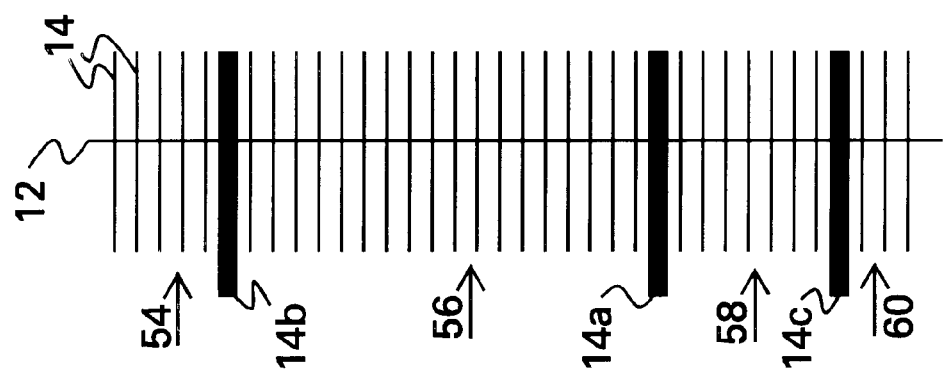
FIGS. 11A–11D illustrate a method for finding the linear order of wires in a crossbar array.
Figure 11C:
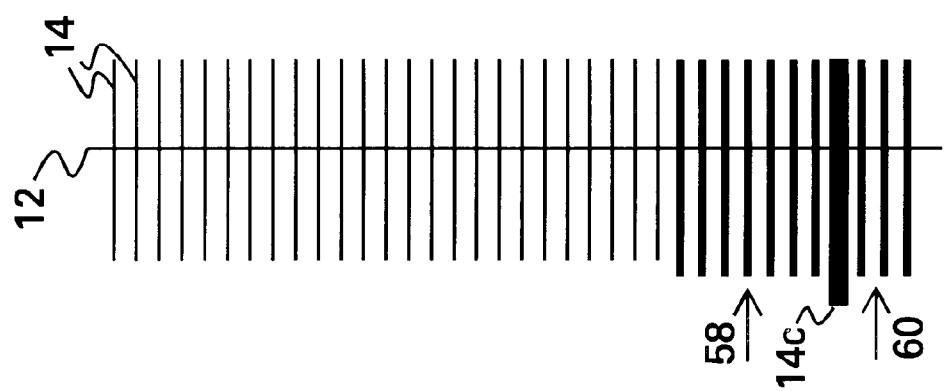
Figure 11B:
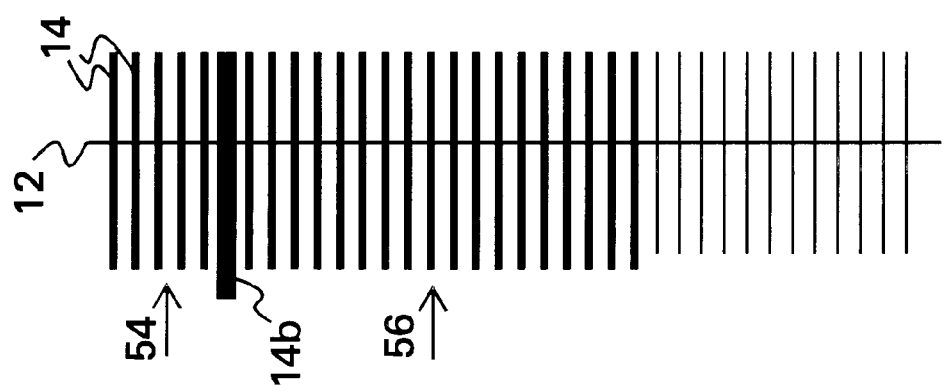
Figure 11A:
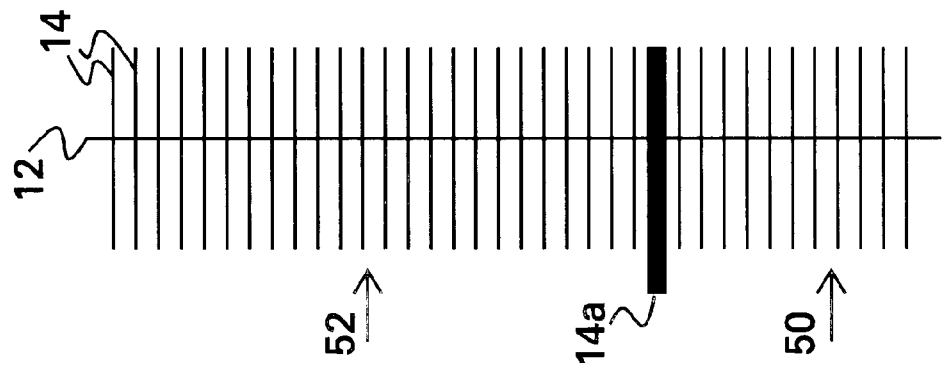

To order the N horizontal nanowires 14 in an array, first connect all of them to one vertical wire 12 using diodes or asymmetric non-linear resistors such that the signal on the vertical wire is the logical OR of the signals on the N horizontal wires (see FIGS. 11A–11D). Choose one of the horizontal wires 14a at random and use it to cut the vertical wire 12. Some number Q of wires below the cut (denoted 50) will influence the output of the vertical OR gate. The wire doing the cutting (wire 14a) and the (N−Q−1) wires 2 above the cut (denoted 52) will have no influence on the OR gate. This permits grouping the horizontal wires into two sets called ABOVE 52 and BELOW 50 (FIG. 11A).

Close the switch that made the cut, and repeat the above procedure using only wires in the set called ABOVE 52. Thus, wire 14b divides the previous ABOVE 52 set into an upper set 54 and a lower set 56 of wires (FIG. 11B).

Then, close the switch that made the cut 14b, and repeat the above procedure using only wires in the set called BELOW 50. Thus wire 14c divides the previous BELOW 50 set into an upper set 58 and a lower set 60 of wires (FIG. 11C).

The wires are now divided into four sets 54, 56, 58, 60 which are ordered from top to bottom (FIG. 11D). This recursive procedure is repeated until all N wires are ordered. The total number of tests of individual wires that need to be perform is about 2N log N. (Note that if one were lucky and always divided each subset exactly into equal parts, then one would only have to test N log N wires.)

Multiplexers and Input/Output (I/O)

Once the crossbar in FIG. 9 can be controlled by setting configuration bits 10, then a small set of long wires 12 going into the crossbar can be used for subsequent input 62 and output 64. The demultiplexer 232 also holds the key to make a multiplexer. In this case, the molecular wire network 30 has some extra-long wires (labeled input 62 and output 64) coming out of it that attach to discrete output ports. These extra-long wires 62, 64 can also be fabricated by direct write or lithographically, since there are so few of them. The demultiplexer 232 and a corresponding demultiplexer (not shown) that controls the vertical nano-wires 12 are used to program the array 30 so as to connect any given cell in the network to one of the output ports. This allows the internal state of any point in the system to be read. One can tie explicitly to the input 62 and output 64 lines internally to the crossbar 30. This is completely analogous to having a relatively small number of I/O pins in an integrated circuit, compared to the total number of wires in the circuit.

Thus, there has been disclosed a demultiplexer for a molecular wire crossbar network comprising junctions formed by crossed nanometer-scale wires joined by bi-stable molecules at the intersecting junctions. It will be apparent to those skilled in this art that various changes and modifications of an obvious nature may be made, and all such changes and modifications are considered to fall within the scope of the appended claims.

What is claimed is:

1. At least one demultiplexer for a two-dimensional array of a plurality of nanometer-scale switches, each switch comprising a junction formed by a pair of crossed wires where one wire crosses another and at least one connector species connecting said pair of crossed wires in said junction, said at least one connector species comprising a bi-stable molecule, said demultiplexer is either (a) assembled in parallel and comprises a first set of wires in said two-dimensional array accessed by a plurality of address lines by randomly forming contacts between each wire in said first set of wires to at least one of said address lines, said first set of wires crossing a second set of wires to form said junctions or (b) assembled serially and comprises said first set of wires in said two-dimensional array accessed by said plurality of address lines by sequentially forming contacts between each wire in said first set of wires to at least one of said address lines, said first set of wires crossing said second set of wires to form said junctions.

2. The demultiplexer of claim 1 further including means for determining a unique address of each wire in said first set of wires using an AND array connected to at least one OR gate.

3. The demultiplexer of claim 1 further including means for determining a linear order of each wire in said first set of wires, by ascertaining which wire is next to which other wire.

4. The demultiplexer of claim 1 wherein said junction has a state that is altered by application of a voltage.

5. The demultiplexer of claim 1 wherein said junction has a state that is sensed by determining its resistance value.

6. The demultiplexer of claim 1 wherein said contact forms an asymmetric non-linear resistor.

7. The demultiplexer of claim 1 wherein said contact forms a diode.

8. The demultiplexer of claim 1 wherein said contact forms a transistor.

9. The demultiplexer of claim 1 wherein at least one of said two wires has a thickness that is about the same size as said at least one connector species, and over an order of magnitude longer than its diameter.

10. The demultiplexer of claim 9 wherein both of said two wires have a thickness that is about the same size as said at least one connector species.

11. The demultiplexer of claim 1 wherein both of said two wires have a thickness that ranges from sub-micrometer to micrometer.

12. The demultiplexer of claim 1 wherein said demultiplexer is serially assembled and there are N wires in said first set of wires, N wires in said second set of wires, and 2 log N address lines, where N is an integer.

13. The demultiplexer of claim 1 wherein said demultiplexer is assembled in parallel and there are N wires in said first set of wires and at least 4 log N address lines associated with said first set of wires, where N is an integer and said contact between a said wire of said first set of wires is either to a gate of a transistor on said address line or to a diode or to an asymmetric non-linear resistor.

14. The demultiplexer of claim 13 wherein said first set of wires extends from a first end to a second end, with said address lines near said first end and said two-dimensional array near said second end, and further including a CMOS driver at said first end and means for logically performing an OR function of said first set of wires at said second end.

15. The demultiplexer of claim 14 in which there are M groups of L wires each, where M×L=N, each group including a said CMOS driver at said first end and a said logical OR means at said second end.

16. Two said demultiplexers of claim 1, a first said demultiplexer associated with said first set of wires in said two-dimensional array and a second said demultiplexer associated with said second set of wires in said two-dimensional array.

17. A method of fabricating at least one demultiplexer for a two-dimensional crossbar array comprising a plurality of crossed-wire devices, each device comprising a junction formed by a pair of crossed wires where a first wire is crossed by a second wire and at least one connector species connecting said pair of crossed wires in said junction, said at least one connector species comprising a bi-stable molecule, said junction having a functional dimension in nanometers, wherein said at least one connector species and said pair of crossed wires form an electrochemical cell, said method comprising (a) forming a first set of wires comprising a plurality of said first wires, (b) depositing said at least one connector species over at least a portion of said first set of wires, (c) forming a second set of wires comprising a plurality of said second wires over said first set of wires so as to form a said junction at each place where a second said wire crosses a first said wire, (d) forming a plurality of address lines outside of said array, and either (e1) randomly forming contacts between each wire in said second set of wires in said array and at least one of said address lines or (e2) sequentially forming contacts between each wire in said second set of wires in said array and at least one of said address lines.

18. The method of claim 17 further including providing means for determining a unique address of each wire in said first set of wires using an AND array connected to at least one OR gate.

19. The method of claim 17 further including providing means for determining a linear order of each wire in said first set of wires, by ascertaining which wire is next to which other wire.

20. The method of claim 19 wherein said ascertaining is accomplished by (a) cutting a said second wire with a first said wire, (b) testing all other said first wires to determine if they are above or below said first cutting wire, (c) reconnecting said cut second wire, (d) recursively repeating steps (a) through (c) for said -first wires above said cut wire, and (e) recursively repeating steps (a) through (c) for said first wires below said cut wire, until said order is determined.

21. The method of claim 17 wherein said junction has a state that is altered by application of a voltage.

22. The method of claim 17 wherein said junction has a state that is sensed by determining its resistance value.

23. The method of claim 17 wherein said contact forms an asymmetric non-linear resistor.

24. The method of claim 17 wherein said contact forms a diode.

25. The method of claim 17 wherein said contact forms a transistor.

26. The method of claim 17 wherein at least one of said two wires has a thickness that is about the same size as said at least one connector species, and over an order of magnitude longer than its diameter.

27. The method of claim 26 wherein both of said two wires have a thickness that is about the same size as said at least one connector species.

28. The method of claim 17 wherein both of said two wires have a thickness that ranges from sub-micrometer to micrometer.

29. The method of claim 17 wherein said demultiplexer is serially assembled and there are N wires in said first set of wires, N wires in said second set of wires, and 2 log N address lines, where N is an integer.

30. The method of claim 17 wherein said demultiplexer is assembled in parallel and there are L wires in said first set of wires, N wires in said second set of wires, and at least 4 log N address lines, where N is an integer and said contact between a said wire of said first set of wires is either to a gate of a transistor on said address line or to a diode or to an asymmetric non-linear resistor.

31. The method of claim 30 wherein said first set of wires extends from a first end to a second end, with said address lines near said first end and said two-dimensional array near said second end, and further including a CMOS driver at said first end and means for logically performing an OR function of said first set of wires at said second end.

32. The method of claim 31 in which there are M groups of L wires each, where M×L=N, each group including a said CMOS driver at said first end and a said logical OR means at said second end.

33. The method of claim 17 wherein two said demultiplexers are formed, a first said demultiplexer associated with said first set of wires of said two-dimensional array and a second said demultiplexer associated with said second set of wires of said two-dimensional array.

* * * * *